United States Patent [19]

Andrieu

[11] Patent Number: 5,648,737

[45] Date of Patent: Jul. 15, 1997

[54] METHOD OF SETTING THE POLARITY OF A DIGITAL SIGNAL, AND INTEGRATED CIRCUITS IMPLEMENTING THE METHOD

[75] Inventor: Vianney Andrieu, Paris, France

[73] Assignee: Alcatel Radiotelephone, Paris, France

[21] Appl. No.: 578,396

[22] Filed: Dec. 26, 1995

Related U.S. Application Data

[63] Continuation of Ser. No. 214,561, Mar. 18, 1994, abandoned.

[30] Foreign Application Priority Data

Mar. 19, 1993 [FR] France ................... 93 03209

[51] Int. Cl.$^6$ ................................................ H03K 5/13
[52] U.S. Cl. ..................... 327/256; 327/28; 327/291; 327/299
[58] Field of Search ..................... 327/231, 256, 327/407, 291, 294, 298, 299, 164, 171, 172, 313, 318, 319, 331, 332; 142/28, 29, 30; 326/38, 56

[56] References Cited

U.S. PATENT DOCUMENTS

| | | | |
|---|---|---|---|
| 3,593,169 | 7/1971 | Markow | 328/223 |
| 4,259,686 | 3/1981 | Suzuki et al. | 327/256 |
| 4,349,754 | 9/1982 | Bull | 327/299 |
| 4,419,757 | 12/1983 | De Gennaro et al. | 327/171 |
| 4,465,944 | 8/1984 | Shin | 307/473 |
| 4,670,714 | 6/1987 | Sievers et al. | 327/256 |
| 4,940,904 | 7/1990 | Lin | 307/262 |
| 4,988,892 | 1/1991 | Needle | 327/256 |
| 5,057,706 | 10/1991 | Bathaee | 327/294 |
| 5,189,319 | 2/1993 | Fung et al. | |
| 5,357,204 | 10/1994 | Knoll | 327/291 |
| 5,504,745 | 4/1996 | Spence et al. | |

*Primary Examiner*—Timothy P. Callahan
*Assistant Examiner*—T. Lam
*Attorney, Agent, or Firm*—Sughrue, Mion, Zinn, Macpeak & Seas

[57] ABSTRACT

A method of setting the polarity of a digital signal coming from a first integrated circuit, said digital signal being representative of data generated within the integrated circuit and requiring application to an input of a second integrated circuit that requires a predetermined polarity. The method comprises storing the required polarity externally to said first integrated circuit at its digital signal output, an acquisition sequence for acquiring the stored polarity while the data is inactive, and an application sequence for applying the acquired polarity to the information when active in order to generate on an output of said first integrated circuit the digital signal for application to the input of said second integrated circuit. The method is applicable in digital systems that include integrated circuits that may come from different sources.

10 Claims, 2 Drawing Sheets

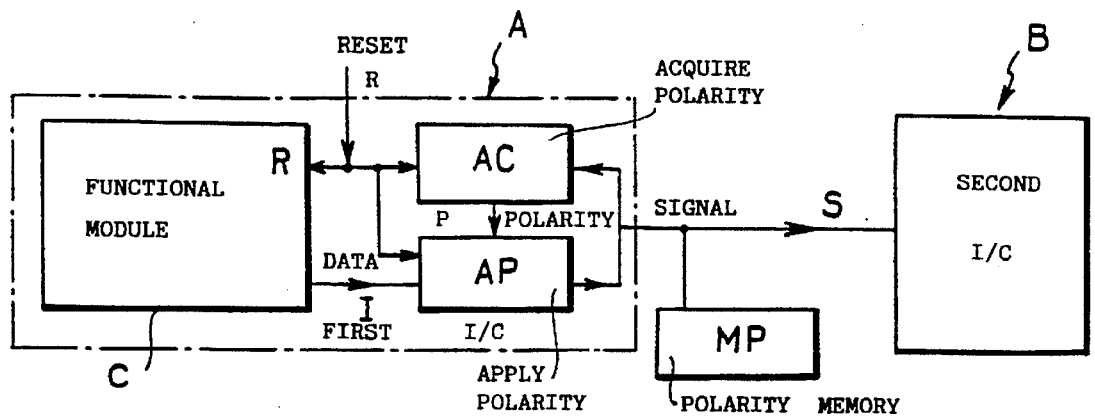
FIG_1
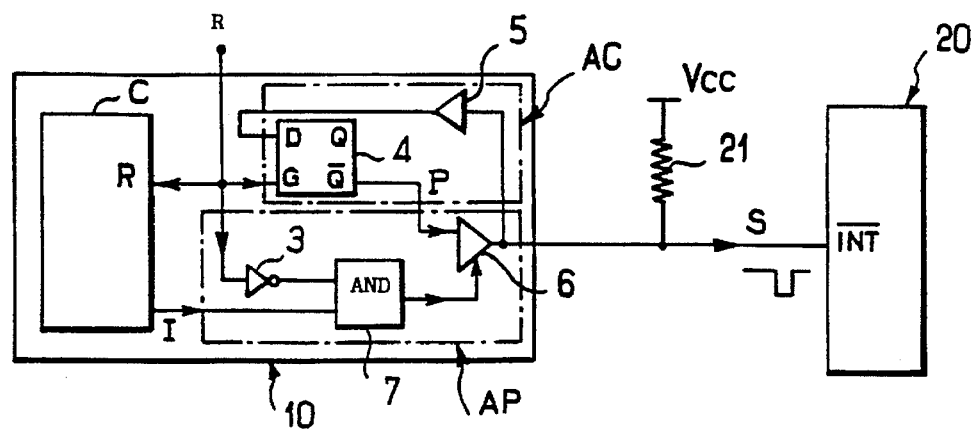
FIG_2A
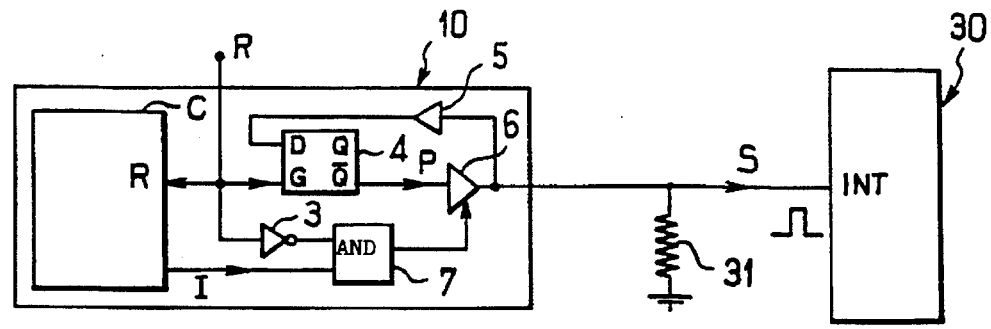
FIG_2B

METHOD OF SETTING THE POLARITY OF A DIGITAL SIGNAL, AND INTEGRATED CIRCUITS IMPLEMENTING THE METHOD

This is a continuation of application Ser. No. 08/214,561 filed Mar. 18, 1994, now abandoned.

The present invention relates to a method of setting the polarity of a digital signal from an integrated circuit.

It also relates to integrated circuits implementing the method.

BACKGROUND OF THE INVENTION

The designers of digital systems are often led to provide for multiple sources of supply for essential components such as microprocessors, microcontrollers, or memories, in order to be able to adapt to the best economic or technological conditions of the moment. Unfortunately, it often happens that components from different sources but that perform the same functions have control inputs of different polarity, e.g. for interrupts.

The term "polarity" is used to designate an arbitrary function that relates a binary value to an electrical level. For example, in circuits that are powered between 0 volts and 5 volts, positive polarity would cause binary level 0 to correspond to a zero voltage level and binary value 1 to corresponding to a voltage level equal to 5 volts; negative polarity would cause binary value 0 to corresponding to a voltage level equal to 5 volts and binary value 1 to a voltage level of zero.

A problem arises when there is a need to connect a first integrated circuit designed to issue data on an output pin, in particular a control signal such as an interrupt request, to a second integrated circuit that may come from different sources and that may thus require either positive polarity or else negative polarity on its input pin that is designed to receive said data. Under such circumstances, it is inconceivable to provide a connection between the circuits without setting polarity.

A first solution consists in providing a signal on an input of the "issuing" first circuit that indicates which polarity is required by the "receiving" second circuit, which signal is combined with the data to be transmitted in order to generate the output signal. However, that solution suffers from the drawback of requiring an additional pin on the circuit concerned and that is hardly conceivable on circuits contained in standardized packages. Even worse, it may happen that a plurality of signals from a given "issuing" first circuit require separate polarity settings. Implementing the above solution would then require a plurality of additional pins to be provided.

A second solution consists in programming a signal indicative of the required polarity inside the first circuit after it has received said signal via an external bus by means of a polarity setting member. The second solution suffers from the drawback of requiring a setting member that is either external or internal to the first circuit. In addition, if the output signal has an influence on the operation of the setting member, as is the case, for example, when the output signal is an interrupt signal, then such a software solution becomes particularly difficult to implement. Furthermore, the problem of determining polarity is not eliminated but is merely displaced to the setting member.

U.S. Pat. No. 4,940,904 is also known, and describes an output circuit for producing pulses that are positive or negative. That relatively complex circuit makes use of a clock signal. It is designed in such a way that the output pulse is delayed relative to the input pulse and the shape of said output pulse depends directly on the shape of the clock signal. The solution implemented consists in producing the two possible forms of the output signal in succession such that one or the other of them is taken into account by the receiving circuit depending on whether it has positive or negative polarity. No genuine setting is provided of the polarity of the output signal.

OBJECT AND SUMMARY OF THE INVENTION

The object of the present invention is to remedy the above drawbacks by providing a polarity setting method that does not require an additional pin to be added to the integrated circuit.

According to the invention, the method of setting the polarity of a digital signal from a first integrated circuit, said digital signal being representative of data generated within said integrated circuit and needing to be applied to an input of a second integrated circuit that requires a predetermined polarity, comprises:

storing the required polarity, outside said first integrated circuit at the output for the digital signal;

an acquisition sequence during which said memorized required polarity is acquired while the data is inactive; and an application sequence during which said required polarity is applied to active data to generate, on an output of said first integrated circuit, the digital signal for application to the input of said second integrated circuit, said polarity acquisition and application sequences being performed within said first integrated circuit.

Thus, the method of the invention makes it possible to solve the problem of setting polarity without requiring an external setting member, with this being done merely by storing the polarity externally to the first circuit. The acquisition and application sequences are internal to the circuit and therefore do not require an additional pin to be provided on the package of the circuit.

In another aspect, the present invention provides an integrated circuit that issues an output digital signal representative of data generated by internal logic means, which signal needs to be applied to an input of a second integrated circuit that requires a predetermined polarity, the integrated circuit implementing the method of the invention and wherein required polarity memory means are provided outside said integrated circuit of the invention, and further including acquisition means for acquiring said required polarity and application means for applying the acquired polarity to the data in order to generate the digital output signal, said application means receiving a polarity signal from the acquisition means and indicative of the required polarity.

BRIEF DESCRIPTION OF THE DRAWINGS

Other features and advantages of the invention appear further from the following description. In the accompanying drawings, given by way of non-limiting example:

FIG. 1 is a block diagram showing the general principle of the method of the invention;

FIG. 2A shows the internal structure of an integrated circuit implementing the method of the invention and connected to an input of a circuit that requires negative polarity;

FIG. 2B shows the integrated circuit of FIG. 2A connected to an input of a circuit that requires positive polarity;

MORE DETAILED DESCRIPTION

Figure 3A:
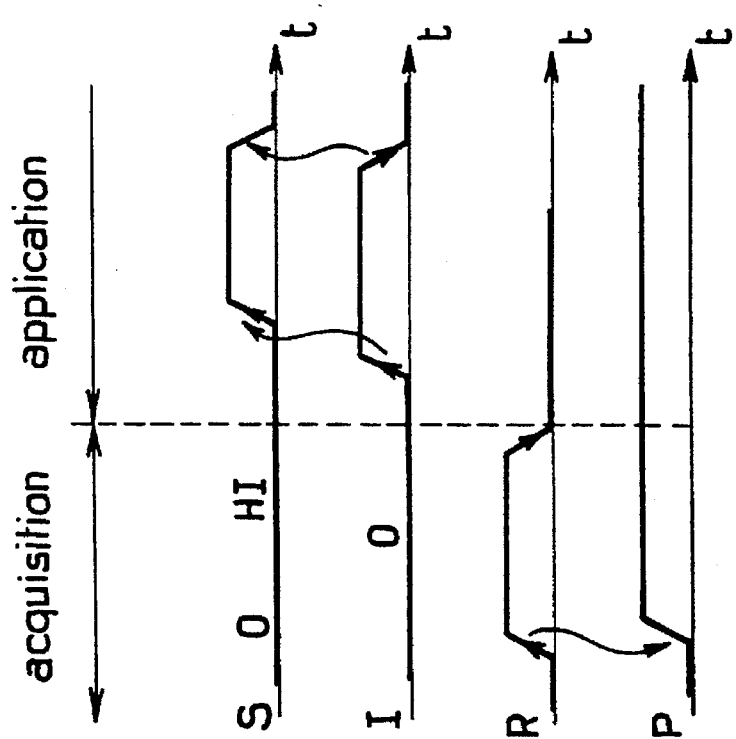
FIG. 3A is a timing diagram for the main signals that are activated in the method of the invention, as applicable to the configuration of FIG. 2A.

With reference to FIGS. 1, 2A, and 2B, there follows a description of a particular implementation of the method of the invention and of an example of a circuit that implements the method of the invention.

Consider a first integrated circuit A designed to implement the method of the invention in such a manner that its output S can be connected without difficulty to an input of a second integrated circuit B that may have either positive polarity or negative polarity.

The integrated circuit A of the invention comprises, in addition to a functional portion C that issues data I for forwarding to the receiving circuit B, a polarity acquisition module AC and a polarity application module AP, and it is provided on its output line with a polarity memory module MP. The polarity acquisition module AC is internal to the circuit A and it receives as inputs both the output signal S and a reset signal R that is also applied to the functional module C, and it generates a polarity signal P which is processed by the polarity application module AP which also receives as inputs both the reset signal R and the data signal I issued by the functional module C. The polarity application module AP generates the output signal S.

The polarity setting method of the invention includes a polarity acquisition stage during which the functional module C is inactive in the sense that the data I is at a "inactive" level, e.g. logic level 0. During this acquisition stage, the output S is put in a high impedance state and the memory module MP maintains said output at a predetermined voltage level corresponding to a logic level that is considered as being inactive. If this logic level is 1 (output voltage equal to 5 volts, for example), then the circuit is in a negative polarity situation; otherwise, for a logic level 0 (output voltage substantially zero), then the circuit is in a positive polarity situation. Activation of the reset signal R causes the acquisition module AC to be operated, and this module "reads" the high impedance level of the output signal S and it generates a polarity signal P. When the reset signal R ceases to be activated, the acquisition phase is over and the polarity application module AP is ready to generate an active output signal in response to an active data input I.

An integrated circuit organized in this way can thus adapt to any polarity, as is illustrated by the two polarity configurations (respectively negative and positive) shown in FIGS. 2A and 2B.

In the first case, where an integrated circuit 10 is connected to a negative polarity input of a circuit 20, e.g. a microprocessor or a microcontroller, it can be seen in FIG. 2A that the polarity memory module is constituted by a pull-up resistor 21 connected to the power supply voltage Vcc, with the output S being connected, for example, to an interrupt input INT (negative polarity) of the microprocessor 20.

In the second case, where the same integrated circuit 10 is connected to a positive polarity input of another microprocessor 30, the polarity memory module is constituted by a pull-down resistor 31 connecting the output to ground, with the output S being connected to an interrupt input INT (positive polarity) of the microprocessor 30.

In both examples, the circuit 10 of the invention comprises, in the acquisition module, a D-type bistable 4 that receives the output signal on its D input via a non-inverting amplifier or "buffer" 5, that receives the reset signal R on a trigger input G, and that delivers the polarity signal P on its inverted output Q.

The circuit 10 also comprises, as its polarity application module, a logic AND gate 7 having one input receiving the logic inverse of the reset signal R via a logic inverter 3, and having its other input receiving the data I issued by the functional module C, together with a "three-state" or "high impedance" type amplifier 6 whose input receives the polarity signal P and which is controlled by the output of the logic AND gate 7, to generate the output signal S.

The amplifier 6 is put on high impedance when its control input, in particular the output signal from the logic AND gate 7, is at logic level 0.

Figure 3B:
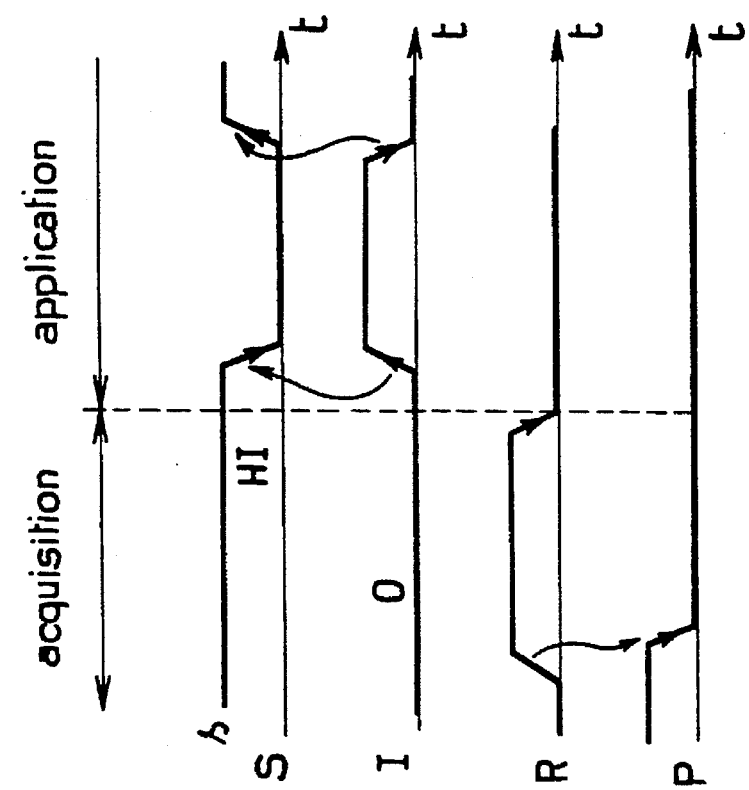
FIG. 3B is a timing diagram of the main signals activated in the method of the invention as applicable to the configuration of FIG. 2B.

With reference to FIGS. 3A and 3B, there follows a detailed description of the sequence in time of the output signal S, and of the polarity signal P as a function of the state of the reset signal R and of the data signal I in both of the above-specified configuration.

In the first case corresponding to negative polarity as shown in FIG. 3A, at the beginning of the acquisition phase, the output S is in a high impedance state at logic level 1 because the three-state amplifier 6 is switched off, the data I is at logic level 0 (inadequate state), and the reset signal R is active, switching from logic level 0 to logic level 1. The input G of bistable 4 is thus activated and the output Q of said bistable 4 memorizes the inverse of the logic level that was present on the data input at the instant a rising edge appeared on the control input G, i.e. the inverse of the logic level of the output S. The polarity signal P is thus placed to logic level 0, which is indicative of negative polarity. The falling edge in the reset signal R marks the end of the acquisition stage and the beginning of the application stage. When the data I switches into an active state (logic level 1), the AND gate 7 generates an output signal of logic level 1 which switches on the three-state amplifier 6, thereby forcing the output S to the same logic level as the polarity signal P, i.e. 0. It can thus be seen that the data I is transmitted in the form of a pulse S of negative polarity.

With reference to FIGS. 2B and 3B, when the receiver circuit is of positive polarity, during the acquisition stage the high impedance rest state of the output S is logic level 0 which corresponds to a substantially zero voltage given the pull-down resistor 31. When the reset signal R is activated, the bistable 4 memorizes the state of its input D, i.e. the logic level 0 on output S, and the polarity signal P is thus forced to logic level 1. During the application stage, whenever the data I becomes active, the AND gate 7 outputs a logic level 1 which switches on the three-state amplifier 6. This amplifier applies to the output S the image of the polarity signal P, namely a logic level 1. When the data I goes back to logic level 0, the output signal S follows it since the three-state amplifier 6 remains activated. It can thus be seen that the output signal S substantially reproduces the data pulse I in the context of positive polarity.

Naturally the invention is not limited to the examples described above, and numerous modifications can be applied to the above examples without going beyond the ambit of the invention.

Thus, the acquisition, application, and memory modules may be designed in numerous ways other than those described above, in particular by using other types of logic gate. In addition, the method of the invention may be applied to setting the polarity of numerous types of signals used in a digital system, in particular acknowledge signals (ACK), interrupt signals (INT) or any other control or monitoring signal.

I claim:

1. A method of setting the polarity of a digital signal provided at an output of a first integrated circuit and supplied to an input of a second integrated circuit, the input of said second integrated circuit requiring a predetermined polarity which can be positive or negative, said digital signal being representative of a data signal, the method comprising the steps of:

initiating a polarity acquisition stage;

storing the predetermined polarity of the input of said second integrated circuit in a polarity memory which is connected to the input of said second integrated circuit;

inputting the stored predetermined polarity to said first integrated circuit;

generating within said first integrated circuit a polarity signal based on the stored predetermined polarity;

after said polarity acquisition stage, generating said data signal; and producing, from said polarity signal and said data signal, said digital signal having the predetermined polarity, so that, when said predetermined polarity is positive, the polarity of said digital signal is set to positive, and when said predetermined polarity is negative, the polarity of said digital signal is set to negative.

2. A method according to claim 1, wherein during the polarity acquisition stage, the output of the first integrated circuit is placed in a high impedance stage and is forced from outside the first integrated circuit to a logic level that is representative of an inactive state in the predetermined polarity.

3. The method according to claim 1, wherein said polarity acquisition stage is initiated by applying a reset signal to said first integrated circuit.

4. A device for setting the polarity of a digital signal which is representative of a data signal, comprising:

a first integrated circuit that issues at an output said digital signal generated by internal logic means, said digital signal being supplied to an input of a second integrated circuit that requires a predetermined polarity which can be positive or negative; and polarity memory means which is connected to the input of said second integrated circuit and which stores the predetermined polarity, wherein said first integrated circuit comprises:

acquisition means for acquiring the predetermine polarity from said polarity memory means and for producing a polarity signal in accordance with the predetermined polarity; and application means for receiving said polarity signal and said data signal to generate said digital signal having the predetermined polarity, so that, when said predetermined polarity is positive, the polarity of said digital signal is set to positive, and when said predetermined polarity is negative, the polarity of said digital signal is set to negative.

5. The device according to claim 4, wherein the application means comprises means for placing the output of said first integrated circuit in a high impedance state while the acquisition means is acquiring the predetermined polarity and producing the polarity signal, and wherein the polarity memory means is organized so that when in said high impedance state the output is held to a logic level representative of an inactive state in the predetermined polarity.

6. The device according to claim 5, wherein the polarity memory means are constituted by a pull-up or down resistor connecting the output either to a power supply line if the predetermined polarity is negative, or else to a ground line if the predetermined polarity is positive.

7. The device according to claim 5, wherein the acquisition means comprises D-type bistable means receiving, on a data input, a signal that is an image of a signal at the output, and, on a control input, a reset signal, and generating the polarity signal which is delivered to the application means.

8. The device according to claim 5, wherein the application means comprises three-state amplifier means receiving the polarity signal as an input, generating the digital signal, and controlled to take up a low impedance state by a control signal that is activated after the acquisition means has produced the polarity signal, said control signal being provided by said means for placing the output of said first integrated circuit in a high impedance state.

9. The device according to claim 8, wherein the application means further comprise control means for combining a reset signal and the data signal in order to generate the control signal for causing the amplifier means to take the low impedance state.

10. The device according to claim 9, wherein the control means comprise a logic AND gate having inputs receiving the data signal and the logical inverse of the reset signal.

* * * * *